United States Patent [19]

Hirai

[11] Patent Number: 5,233,134
[45] Date of Patent: Aug. 3, 1993

[54] MOUNTING ARRANGEMENT FOR A SEMICONDUCTOR DEVICE

[75] Inventor: Minoru Hirai, Kyoto, Japan

[73] Assignee: Rohm Co., Ltd., Kyoto, Japan

[21] Appl. No.: 894,096

[22] Filed: Jun. 5, 1992

[30] Foreign Application Priority Data

Oct. 26, 1991 [JP] Japan .................................. 3-306559

[51] Int. Cl.⁵ ............................................. H05K 1/00
[52] U.S. Cl. ...................................... 174/260; 29/827; 361/767; 361/807
[58] Field of Search ................... 174/259, 260; 29/827; 361/397, 400, 403, 417

[56] References Cited

U.S. PATENT DOCUMENTS 4,605,986  8/1986  Bentz et al. .......................... 361/386
4,845,842  7/1989  Miller et al. .......................... 29/827

Primary Examiner—Leo P. Picard
Assistant Examiner—Trinided Korka
Attorney, Agent, or Firm—Brumbaugh, Graves, Donohue & Raymond

[57] ABSTRACT

In the disclosed semiconductor device mounting arrangement, an integrated circuit has an elastic body on one surface and protruding electrodes on the opposite surface and a support frame includes a pressing member to engage the elastic body directly so as to force the protruding electrodes into engagement with a wiring pattern formed on a substrate. In the disclosed semiconductor device mounting method, a liquid crystal display panel having an integrated circuit with protruding electrodes is placed on a wiring pattern and an elastic body is provided on the surface of the integrated circuit which is opposite from the protruding electrodes. The assembled components are positioned between a pressing portion and a base member of a support frame so that the elastic body is compressed and the reaction from the compression is utilized to engage the protruding electrodes with the wiring pattern.

2 Claims, 1 Drawing Sheet

MOUNTING ARRANGEMENT FOR A SEMICONDUCTOR DEVICE

BACKGROUND OF THE INVENTION

This invention relates to semiconductor mounting arrangements and to methods for mounting semiconductor devices.

Heretofore, a so-called "face-down mounting structure" has been employed for liquid crystal display units or printing heads in which electrodes projecting from an integrated circuit are connected directly to a wiring pattern on a substrate without using lead wires. In such mounting structures, the integrated circuit is held in place with a resin. On the other hand, in semiconductor device mounting arrangements, a plurality of semiconductor devices are positioned close to one another. Therefore, when it is necessary to replace one of the semiconductor devices, the resin which holds the integrated circuit must be melted. However, this resin-melting operation is disadvantageous because the heating of the resin adversely affects other integrated circuits.

In order to overcome this difficulty, the present applicant has previously proposed, in unexamined Japanese Patent Application No. 39464/1990, a semiconductor device mounting structure of the type shown in FIG. 2. That structure includes an integrated circuit 104 engaging a glass substrate 109 with two electrodes 105 protruding from the pad of the integrated circuit 104. Those electrodes are pushed against a wiring pattern 106 formed on the glass substrate 109 by a cap 102 covering the integrated circuit 104 and having legs which are bonded to the plate. An elastic body 103 is provided between the cap 102 and the integrated circuit 104 to push the protruding electrodes 105 against the wiring pattern 106. As shown in FIG. 2, the cap 102 is mounted on the plate 109 by adhesive 107. In addition, another glass plate 108 is mounted adjacent to the plate 109 and liquid crystal material is sealed between the two glass substrates 108 and 109, thus forming a liquid crystal display module.

In order to push the integrated circuit 104 against the wiring pattern 106 in the above-described semiconductor mounting structure, it is necessary to provide the cap 102 with the elastic body 103. Consequently, the structure has the disadvantage that it requires a relatively large number of components, and a correspondingly large number of manufacturing steps, with the result that it has a high manufacturing cost.

SUMMARY OF THE INVENTION

Accordingly, an object of this invention is to provide a mounting arrangement for a semiconductor device which overcomes the above-described disadvantages of the prior art.

Another object of the invention is to provide a mounting method and arrangement for a semiconductor device in which protruding electrodes of an integrated circuit can be pressed against a wiring pattern formed on a substrate which is provided for the integrated circuit.

These and other objects of the invention are attained by providing a mounting arrangement for a semiconductor device wherein protruding electrodes of an integrated circuit engage a wiring pattern formed on a substrate including an elastic member engaging the surface of the integrated circuit which is opposite to the surface from which the electrodes protrude and a frame having a pressing portion for pressing the semiconductor device toward the substrate, in which the elastic member is pressed directly by the pressing portion of the frame to hold the protruding electrodes against the wiring pattern.

In the semiconductor device mounting arrangement according to the invention, unlike conventional arrangements, a predetermined pressing force to force the protruding electrodes against the wiring pattern can be obtained without requiring any cap member.

According to another aspect of the invention, a semiconductor device mounting method is provided in which protruding electrodes of an integrated circuit engage a wiring pattern formed on a substrate so as to be connected to the wiring pattern in which the substrate and the integrated circuit engaged with the wiring pattern are inserted into a space formed between a pressing portion and a base member and an elastic member positioned on the surface of the integrated circuit which is opposite from the surface having the protruding electrodes is pressed directly by the pressing portion so that the protruding electrodes engage the wiring pattern.

In the method of the invention, a predetermined pressing force to connect the protruding electrodes to the wiring pattern is obtained without requiring a cap.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
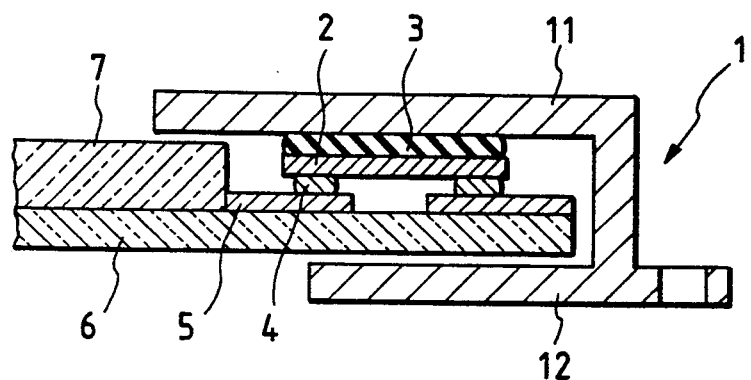
FIG. 1 is a schematic cross-sectional view showing a representative embodiment of a semiconductor device mounting arrangement according to the invention.
Figure 2:
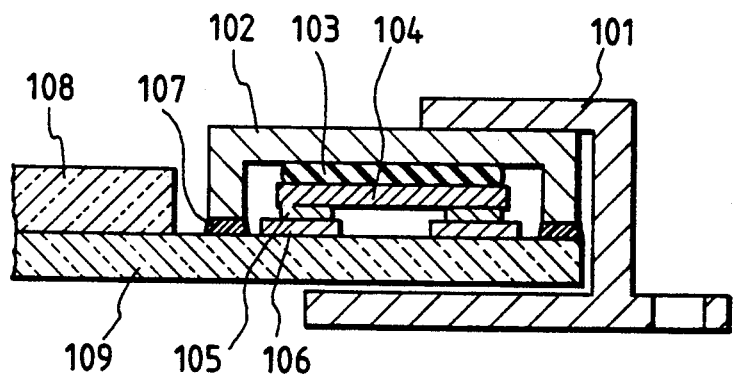
FIG. 2 is a schematic cross-sectional view showing a conventional semiconductor device mounting arrangement.

In the typical example of a semiconductor device mounting arrangement according to the invention shown in FIG. 1, a semiconductor device support frame 1 is arranged to support an integrated circuit 2 having protruding electrodes 4, an elastic body 3, a first glass substrate 6 with a wiring pattern 5, and a second glass substrate 7. Liquid crystal material is sealed between the first and second glass substrates 6 and 7, thus forming a liquid crystal display module.

The support frame 1 is made of a metal such as aluminum alloy and is mounted on a liquid crystal display unit body with screws (not shown), for example. The support frame 1 is made up of a pressing portion 11, which has an L-shaped cross-section, and a base member 12 integral with the pressing member 11, that is, the support frame 1 is substantially U-shaped in cross-section. The vertical portion of the L-shaped pressing portion 11 has a height selected with respect to the dimensions of the other components so that the elastic body 3 is compressed against the upper surface of the integrated circuit 2 with a predetermined pressure. Thus, the height is suitably determined from the thicknesses of the integrated circuit 2, the elastic body 3, and the first and second glass substrates 6 and 7. For example, where the integrated circuit 2 is 0.4 mm thick, the first glass substrate 6 is 1.1 mm thick, the uncompressed elastic body 3 is 1.0 mm thick, and the vertical portion of the pressing member 11 is 2.2 mm high, the elastic body 3 is compressed 30%, from 1.0 mm to 0.7 mm, when the components are assembled. The horizontal portion of the pressing portion 11 is long enough to cover a predetermined peripheral area of the second glass substrate 7.

The length of the pressing portion 11 is suitably determined from the width of the integrated circuit 2 and the area of the second glass substrate 7 to be covered. For instance, where the integrated circuit 2 is 5 mm wide and the wiring region outside of the second glass substrate 7 is 10 mm in width, the length of the horizontal portion of the pressing member 11 is on the order of 10 mm. The wall thickness of the pressing portion 11 is selected so that the pressing portion 11 has a high enough rigidity to maintain a predetermined compression of the elastic body 3 when it is compressed. That is, the wall thickness of the pressing portion 11 is determined by the compressibility of the elastic body 3. The pressing force applied to four protruding electrodes 4 from an integrated circuit 2 is about 30 to 50 g. Therefore, in the case of an integrated circuit with 200 protruding pins, the wall of the pressing portion 11 should be thick enough to provide a pressing force of 6 to 10 kg.

Similarly, the wall thickness and the width of the base member 12 of the support frame 1 are selected so that the base member 12 is able to withstand the bending force produced by the pressing portion 11. In other words, the wall thickness and width are determined according to the bending force produced by the pressing portion, and should be large enough to withstand a bending force with a moment of 60 to 100 kg mm = (6 to 10 kg) × 10 mm.

The elastic body 3 is preferably made of silicone rubber to provide good heat resistance and low manufacturing cost. The thickness of the elastic body 3 is suitably determined according to the material used to form the elastic body 3. For instance, where the elastic body 3 is made of silicone rubber having a hardness value of 40 to 60, and the integrated circuit has about 100 pins, the thickness should be selected so that the compression is about 30%.

The integrated circuit 2, the protruding electrodes 4, and the first and second glass substrates 6 and 7 are the same as those used in the conventional semiconductor device mounting arrangements.

Now, a typical semiconductor device mounting method according to the invention will be described.

First, the elastic body 3 is mounted on the surface of the integrated circuit 2 which is opposite to the surface having the protruding electrodes 4. The integrated circuit 2 together with the elastic body 3 is positioned on the wiring pattern 5 which is formed on the first glass substrate 6. In this case, the integrated circuit 2 may be bonded to the wiring pattern 5 with adhesive, if desired. Thereafter, the first glass substrate 6, on which the integrated circuit 2 has been positioned, is inserted a predetermined distance into the space formed between the pressing portion 11 and the base member 12 of the support frame 1. In this condition, the pressing portion 11 is deformed sufficiently to compress the elastic body 3 to the required extent. More specifically, the vertical portion of the pressing member 11 is initially oriented upwardly from the base member 12 so that it forms almost a right angle with the base member. When the pressing member is moved to the illustrated position with the assembled components in place, the elastic body 3 is compressed and the force resulting from the compression pushes the protruding electrodes 4 against the wiring pattern 5 with a predetermined force, so that the protruding electrodes 4 are positively engaged with the wiring pattern 5.

As described above, with the semiconductor device mounting arrangement of the invention, the elastic body is compressed by the pressing member of the support frame, and the reaction against the compression is utilized to connect the protruding electrodes to the wiring pattern without requiring any cap. Hence, the semiconductor device mounting arrangement of the invention, when compared with conventional mounting arrangements, has fewer components and accordingly requires fewer manufacturing steps so that it has a reduced manufacturing cost.

Although the invention has been described with reference to specific embodiments, it will be obvious to those skilled in the art that various changes and modifications may be made therein. Accordingly, all such changes and modifications are included within the scope of the invention.

I claim:

1. A semiconductor device mounting arrangement comprising an integrated circuit having electrodes protruding from one surface, a wiring pattern formed on a substrate, elastic means on a surface of the integrated circuit which is opposite to the surface having the protruding electrodes, and a frame having a pressing portion for receiving the substrate, the integrated circuit and the elastic member so that the elastic member is pressed directly by the pressing portion of the frame to force the protruding electrodes against t he wiring pattern.

2. A method for mounting a semiconductor device, including an integrated circuit having protruding electrodes and a wiring pattern formed on a substrate with which the protruding electrodes are to be engaged comprising providing a frame having a pressing portion spaced from a frame member to receive the substrate with the wiring pattern and the integrated circuit therebetween, and providing an elastic member on the surface of the integrated circuit which is opposite to the surface from which the electrodes protrude so that the pressing portion presses directly on the elastic member to force the protruding electrodes into engagement with the wiring pattern.

* * * * *